United States Patent [19]

Sakai et al.

[11] Patent Number: 5,246,886
[45] Date of Patent: Sep. 21, 1993

[54] PROCESS FOR DEPOSITING A SILICON-CONTAINING POLYCRYSTALLINE FILM ON A SUBSTRATE BY WAY OF GROWING GE-CRYSTALLINE NUCLEUS

[75] Inventors: Akira Sakai, Nagahama; Shunichi Ishihara, Ebina; Isamu Shimizu, Yokohama, all of Japan

[73] Assignee: Canon Kabushiki Kaisha, Tokyo, Japan

[21] Appl. No.: 903,939

[22] Filed: Jun. 26, 1992

[30] Foreign Application Priority Data

Jun. 28, 1991 [JP] Japan ................ 3-184158

[51] Int. Cl.$^5$ ........................ H01L 21/465
[52] U.S. Cl. ...................... 437/228; 437/233; 437/109; 437/111; 437/965; 437/967; 437/131
[58] Field of Search ............. 437/228, 233, 109, 111, 437/937, 967; 148/DIG. 122

[56] References Cited

U.S. PATENT DOCUMENTS 4,477,311 10/1984 Mimura et al. ............ 437/133
4,835,005 5/1989 Hirooka et al. ............ 437/225
4,885,258 12/1989 Ishihara et al. .
4,992,134 2/1991 Gupta et al. ............ 437/937

FOREIGN PATENT DOCUMENTS 58-137218 8/1983 Japan .

OTHER PUBLICATIONS

J. Electrochemical Soc., vol. 130, No. 7, pp. 1571–1580, Jul. 1983, Jastrzebski et al., "Growth Process of Silicon Over SiO2 by CVD etc.".

Primary Examiner—George Fourson
Attorney, Agent, or Firm—Fitzpatrick, Cella, Harper & Scinto

[57] ABSTRACT

A process for forming a silicon-containing polycrystalline film on a substrate by a chemical vapor deposition method, said process comprises the steps of:
(a) forming a thin film comprising silicon and germanium atoms on said substrate,
(b) subjecting said thin film to etching treatment so that a crystalline nucleus comprising germanium atoms as the main constituent remains on the surface of said substrate, and
(c) growing said crystalline nucleus to thereby form a silicon-containing polycrystalline film on said substrate.

9 Claims, 3 Drawing Sheets

PROCESS FOR DEPOSITING A SILICON-CONTAINING POLYCRYSTALLINE FILM ON A SUBSTRATE BY WAY OF GROWING GE-CRYSTALLINE NUCLEUS

BACKGROUND OF THE INVENTION

1. Field of The Invention

The present invention relates to an improved process which makes it possible to form a silicon-containing polycrystalline functional film on a substrate, which is eligible to use as a constituent semiconductor member of various semiconductor devices such as solar cells, scanning circuits of image-reading devices such as line photosensors, area photosensors, etc., thin film transistors (TFT), TFT arrays or matrixes used not only in operation circuits of liquid crystal displays but also in switching circuits of photosensors photosensitive devices. More particularly, the present invention relates to an improved process for forming a large area polycrystalline functional film containing silicon and germanium atoms by way of etching a thin film containing silicon and germanium atoms formed on a substrate so that a crystalline nucleus remains on said substrate and growing said crystalline nucleus.

2. Related Background Art

As for the method of forming a polycrystalline silicon film, there are known normal-pressure CVD method, low pressure CVD method (LP-CVD method), plasma CVD method, and the like. Among these methods, the low pressure CVD method has been widely used in order to form the polycrystalline silicon film. However, in the case of forming a polycrystalline silicon film by means of the low pressure CVD method, the substrate on which said polycrystalline silicon film is to be formed is required to maintain at elevated temperature during film formation and because of this, it is necessary to use a specific member of a high melting point such as quartz member as the substrate. Thus, there is a disadvantage for the low pressure CVD method that the polycrystalline silicon film product obtained unavoidably becomes costly.

In order to eliminate this disadvantage, there have been made various studies of electron cyclotron resonance plasma CVD method (ECR plasma CVD method), molecular beam epitaxy method (MBE method), and sputtering method in which a polycrystalline silicon film may be formed at a relatively low substrate temperature. However any of these methods is accompanied by unsolved disadvantages that a number of film-forming parameters required to be controlled upon film formation are present and it is difficult to stably and continuously form a large area polycrystalline silicon film having a uniform film property all over the entire of the substrate.

Other than the above, studies have been made of selective growth of a silicon single crystal as one of the silicon-on-insulator (SOI) techniques in order to develop a three dimensional integrated circuit. For instance, there has been proposed a method of repeating the cycle comprising crystal growth and film-etching in order to prevent formation of a crystalline nucleus on a $SiO_2$ film in the low pressure CVD method with $SiH_2Cl_2$-HCl system (see, L. Jastrzebski et al., J. Electrochem. Soc. 130(1983), pp. 1571). This method belongs to an epitaxial growth method comprising forming a $SiO_2$ film on a silicon single crystal, forming a window at the surface of the $SiO_2$ film to expose the silicon single crystal, and growing single crystal utilizing the exposed single crystal silicon as a seed. Particularly, in view of causing a detardation time for a crystalline nucleus to be formed on the $SiO_2$ film differently from the case where a crystalline nucleus is formed on a Si single crystal film, this method comprises alternately repeating step (i) of introducing $SiH_2Cl_2$ gas to grow a Si crystalline nucleus on a $SiO_2$ film within the detardation time and step (ii) of etching the Si crystalline nucleus formed on the $SiO_2$ film using HCl gas instead of the $SiH_2Cl_2$ gas, whereby forming a polycrystalline film. However there are disadvantages for this method that not only the time allocation of each of the repetition crystal growth and film-etching cycles but also the crystal growth temperature greatly influence to defect density of a crystal grown and it is extremely difficult to eliminate defects relative to twin, transfer defect, lamination defect, void, etc. even by properly controlling said time allocation and crystal growth temperature. There are also other disadvantages for this method that a relatively inexpensive ordinary substrate member such as glass plate cannot be used because the processing temperature is high and it is difficult to always form a polycrystalline silicon film containing grains of a large grain size with small grain boundaries without depending upon the kind of a substrate used.

Japanese Laid-open patent application Sho.63(1988)-44719 discloses a method of forming a polycrystalline silicon film at a relatively low substrate temperature. This method comprises separately introducing into a film-forming space, an active species (A) obtained from a silicon and halogen-containing compound and an active species (B) obtained from hydrogen gas or halogen gas, reacting said active species (A) and (B) to deposit a silicon film on a substrate placed in said film-forming space while introducing a gaseous substance having an etching property into said film-forming space to etch the surface of said film deposited on the substrate, whereby crystal growth in a given orientation is preferentially caused. Particularly, in the formation of a polycrystalline silicon film according to this method, there is used, as the substrate, a glass plate having a Si—N—H film thereon which is patterned with respect to its surface portions at which selective growth of a crystalline nucleus is to be caused. It is understood that a polycrystalline silicon film may be obtained at a relatively low substrate temperature according to this method. In the case of forming a polycrystalline silicon film on a commercially available inexpensive substrate such as glass plate according to this method, an insulating film such as Si—N—H film is firstly formed on such substrate (glass plate), the insulating film (Si—N—H film) formed on the substrate is subjected to patterning to provide patterns at a predetermined interval at the surface thereof, and formation of a polycrystalline silicon film is performed while selectively growing crystalline nucleuses formed at those patterns. The patterning in this case includes application of a resist, mask adjustment, exposure, development and removal of the resist. Thus, it is extremely difficult to stably and repeatedly form a high quality polycrystalline silicon film at an industrial scale according to this method, since there are often caused problems relative insufficient development, residue of the resist, uneven etching, formation of undercut portions, and the like which lead to increase crystalline defects for the film formed.

Other than the above, International Publication No. WO90/12126 discloses a method of forming a polycrystalline silicon film on a non-single crystal substrate such as glass plate by chemical vapor deposition, comprising the steps of exciting hydrogen gas by the action of an activation energy to generate active species (H) in a space other than a film-forming space of a film-forming chamber containing the substrate therein, introducing the active species (H) and a silicon-containing film-forming raw material gas into the film-forming space at the same time but separately from each other, bringing the active species (H) into contact with the film-forming gas by mixing them to produce a plasma region in the film-forming space kept at a predetermined pressure, and periodically changing the concentration of the active species (H) near the surface of the substrate maintained at a predetermined temperature, whereby causing said polycrystalline silicon film on the substrate. This method makes it possible to form a polycrystalline silicon film having a good orientation at a relatively low substrate temperature. However, there is still a disadvantage for this method that it is difficult to provide uniform distribution of the concentration of the active species (H) allover the entire surface of the substrate and because of this, a well-skilled technique is required in order to form a uniform polycrystalline silicon film all over the entire surface of a large area substrate. In addition, the crystal grain size of the polycrystalline silicon film obtained according to this method is at most of about 5000 Å.

In view of what above described, there is a demand for provision of an improved method which makes it possible to stably and repeatedly form a high quality large area polycrystalline silicon film containing crystal grains of a large size in a simple manner.

SUMMARY OF THE INVENTION

The principal object of the present invention is to overcome the foregoing problems in the prior art and to provide an improved film-forming process which enables one to stably form a large area high quality silicon-containing polycrystalline film containing crystal grains of a large grain size, which has a uniform film property all over the entire of the film.

Other object of the present invention is to provide an improved film-forming process which enables one to stably and repeatedly form a large area high quality silicon-containing polycrystalline film containing crystal grains of a large grain size, which excels in uniformity of film property, at a low substrate temperature without providing any crystalline nucleus-forming face by means of patterning.

A further object of the present invention is to provide an improved film-forming process which enables one to stably and repeatedly form a high quality silicon-containing polycrystalline film containing crystal grains of a large grain size, which is suitable for use as a constituent element of various semiconductor devices such as solar cell, thin film transistor (TFT), etc.

A further object of the present invention is to provide an improved film-forming process which enables one to stably form a large area high quality silicon and germanium-containing polycrystalline film containing crystal grains of a large grain size, which has a uniform film property all over the entire of the film.

DETAILED DESCRIPTION OF THE PREFERRED EMBODIMENTS

Figure 1:
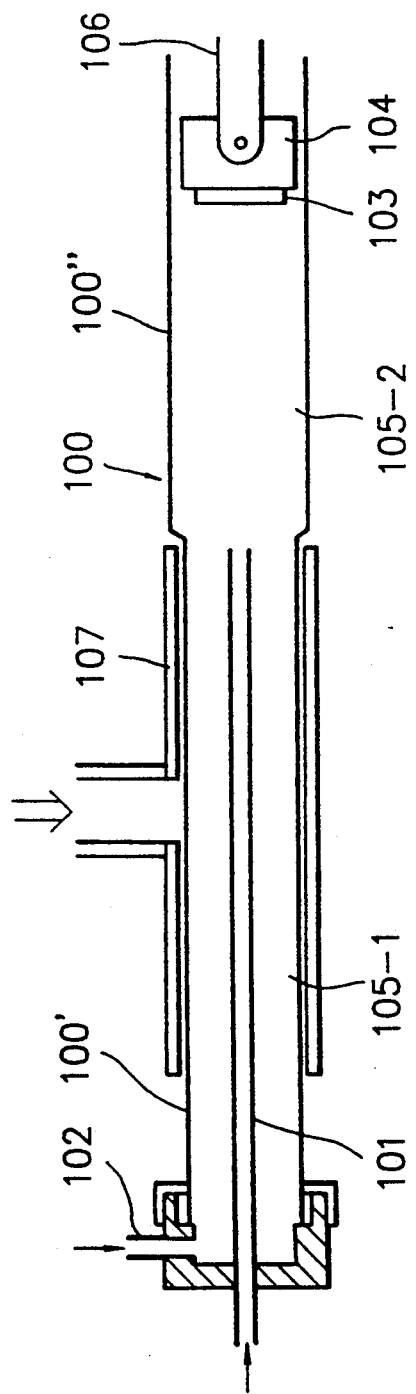
FIG. 1 is a schematic diagram illustrating an example of the film-forming apparatus suitable for practicing the film-forming process according to the present invention.

The present invention will be detailed by reference to the typical embodiments which are provided for illustrative purposes. The present invention is not restricted by these embodiments. These embodiments can be properly modified as long as the objects of the present invention is attained.

The principal feature of the film-forming process according to the present invention which attains the foregoing objects comprises forming a thin film containing silicon and germanium atoms on a substrate by means of a chemical vapor deposition technique; etching the thin film so that a crystalline nucleus comprising germanium atoms (Ge) as the main constituent remains on the substrate; and growing the crystalline nucleus, to thereby form a polycrystalline film containing silicon atoms on the substrate.

According to the film-forming process of the present invention, the foregoing problems in the prior art are effectively eliminated and the objects of the present invention are attained. Particularly, according to the film-forming process of the present invention, there may be effectively formed a desirable high quality silicon-containing polycrystalline film having a uniform film property all over the entire surface of a large area substrate at a low substrate temperature. The silicon-containing polycrystalline film formed according to the film-forming process of the present invention is superior to any of the known silicon-containing polycrystalline films formed by a conventional process not only in view of the film quality but also in view of adhesion with the substrate. The silicon-containing polycrystalline film formed according to the film-forming process of the present invention excels particularly in adhesion with the base member (substrate) on which the film is to be formed. As for the reason for this, it is not clear enough, but it is considered that in the film-forming process of the present invention, since the formation of the silicon-containing polycrystalline film is performed by growing a crystalline nucleus comprising germanium atoms (Ge) as the main constituent which is provided by subjecting an a-SiGe film to etching treatment with the use of hydrogen plasma, silicon atoms (Si) are deposited on the substrate in a most stable state while relaxing the stress of the film formed to cause the formation of a homogeneous and structurally dense silicon-containing polycrystalline film.

The silicon-containing polycrystalline film formed according to the film-forming process of the present invention contains crystal grains of a large grain size with small grain boundaries and because of this, the silicon-containing polycrystalline film is eligible to use as a constituent semiconductor member of various semiconductor devices. In fact, when the film-forming process of the present invention is employed in the production of a large area semiconductor device such as solar cell, image reading device, electrophotographic photosensitive device or TFT array for use in the operation circuit of a liquid crystal display, the large area semiconductor device obtained becomes such that exhibits improved semiconductor characteristics.

The present invention has been accomplished based on the findings obtained as a result of experimental studies by the present inventors in order to attain the objects of the present invention.

The present inventors made experimental studies through the following experiments wherein a thin film comprising silicon and germanium atoms (hereinafter referred to as SiGe thin film) was formed on a given substrate and the SiGe thin film was subjected to etching treatment with the use of hydrogen plasma in order to attain the objects of the present invention. As a result, there were obtained the following two findings. That is, (i) in the case of etching an a-SiGe film formed on a substrate with hydrogen plasma, there is a distinct difference between the etching rate for the Si region and that for the Ge region, and the etching rate for the Si region is distinguishably higher than that for the Ge region; (ii) when an a-SiGe film formed on a substrate is provided and the a-SiGe film product is subjected to hydrogen plasma treatment, a crystalline nucleus comprising germanium atoms (Ge) as the main constituent remains on the substrate; and (iii) when the process of forming a polycrystalline silicon film is performed using the substrate having such crystalline nucleus comprising germanium atoms (Ge) as the main constituent thereon, there is deposited a desirable polycrystalline silicon film with an improved crystallinity and containing crystal grains of a large grain size as large as about 1 μm in terms of mean value on said substrate.

In the following, explanation will be made of the experiments performed by the present inventors.

Shown in FIG. 1 is a schematic diagram of the film-forming apparatus used in the experiments.

The film-forming apparatus shown in FIG. 1 comprises a substantially enclosed reaction vessel 100 made of an insulating material such as quartz, alumina, etc. which is capable of maintaining an integral structure composed of an activation chamber 100' and a film-forming chamber 100'' under vacuum. Numeral reference 105-1 stands for an activation space of the activation chamber 100', and numeral reference 105-2 stands for a film-forming space of the film-forming chamber 100''. An exhaust pipe (not shown) is arranged at an end of the film-forming chamber 100'', and the exhaust pipe is communicated through an exhaust valve (not shown) to an exhaust system such as turbo molecular pump (not shown). Numeral reference 103 stands for a substrate on which a film is to be formed. The substrate 103 is placed on a substrate holder 104. The substrate holder 104 is arranged on the tip of a transfer shaft 106 which is capable of moving back and forth and is arranged in the film-forming chamber 100''. The substrate holder 104 contains an electric heater (not shown) for heating the substrate 103. Numeral reference 107 stands for an applicator of a high frequency power such as RF power of 13.56 MHz or microwave power of 2.45 GHZ. The applicator is arranged to surround the circumferential wall surface of the activation chamber 100'. The applicator 107 is extending from a RF power source (13.56 MHz) or a microwave power source (2.45 GHz) (not shown) through a matching box (not shown). Numeral reference 101 stands for a gas conduit for feeding a film-forming raw material gas such as $SiF_4$ gas capable of producing an active species (A) upon application of a RF power or a microwave power thereto. The gas conduit 101 extends toward the film-forming space 105-2, running horizontally in the center of the activation space 105-1 of the activation chamber 100', in parallel with the circumferential wall of the activation space, and the end of the gas conduit 101 opens at the position where the film-forming space 105-2 starts. The gas conduit 101 is made of an insulating material such as quartz, alumina, etc. The film-forming raw material gas during passing through the gas conduit 101 is excited and decomposed to produce the active species (A) by the action of high frequency energy (RF energy or microwave energy) from the applicator 107, which is coupled into the gas conduit 101. To the gas conduit 101 is connected a feed pipe (not shown) for the film-forming raw material gas, extending from a gas reservoir (not shown). Numeral reference 102 stands for a gas feed pipe for introducing a raw material gas such as $H_2$ gas capable of producing an active species (B) which is chemically reactive with the active species (A). The gas feed pipe 102 is open into the activation space 105-1 of the activation chamber 100' at a position upstream the activation chamber 100'. The gas feed pipe 102 is extending from a gas reservoir (not shown). The raw material gas is fed through the gas feed pipe 102 into the activation space 105-1, where it is excited by the action of high frequency energy (RF energy or microwave energy) from the applicator 107 to produce plasma containing the active species (B), which is successively flown into the film-forming space 105-2. The active species (A) and the active species (B) introduced into the film-forming space 105-2 are chemically reacted to cause the formation of a deposited film on the surface of the substrate 103 maintained at a predetermined temperature. In this case, the substrate 103 is properly positioned at a predetermined position in the film-forming space 105-2 by driving the transfer shaft 106. Upon forming the deposited film, the inside of the reaction vessel 100 is brought to a predetermined gas pressure by actuating the exhaust system (not shown).

EXPERIMENT 1

There were provided a plurality of a-SiGe film samples of 10 Å in film thickness which were different with respect to the content of germanium atoms (Ge) (hereinafter referred to as Ge content). (It is well known that the Ge content in an a-SiGe film can be properly controlled by changing the flow rate of a Ge-imparting raw material gas upon forming the a-SiGe film by means of a plasma CVD technique).

Each of the a-SiGe film samples was formed on a glass substrate (manufactured by Corning Glass Works, Article No. 7059) using $SiH_4$ gas, $GeH_4$ gas (diluted with $H_2$ gas) and $H_2$ gas by means of a conventional RF glow discharge plasma CVD technique under the film-forming conditions shown in Table 1, wherein the flow rate of the $GeH_4$ gas was varied in the range of $2.5\times10^{-6}$ to $2.5\times10^{-2}$ sccm and the film formation period was made constant at a period of 10 seconds.

Each of the a-SiGe film samples thus provided was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the exhaust system (not shown). Then $H_2$ gas was fed into the activation space 105-1 through the gas feed pipe 102 at a flow rate of 20 sccm. Subsequently, the inner pressure of the reaction vessel 100 was controlled to 20 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the $H_2$ gas was excited and decomposed by the action of the microwave energy to generate hydrogen gas plasma, which was successively flown into the film-forming space 105-2 and supplied to the surface of the a-SiGe film sample. This plasma treatment was continued for 5 seconds. The introduction of the $H_2$ gas and the application of the high frequency power were terminated. At the same time, the electric heater for the substrate was switched off. Thereafter Ar gas from an independent gas reservoir (not shown) was fed into the activation chamber 105-1 through the gas feed pipe 102 and introduced into the film-forming space 105-2. After the inner pressure of the reaction vessel 100 became normal pressure and the plasma treated a-SiGe film sample cooled to room temperature, the plasma treated a-SiGe film sample was taken out from the reaction vessel. In this way, said plurality of a-SiGe film samples were treated with hydrogen plasma.

As for each of the plasma treated a-SiGe film samples, its surface state was observed by a commercially available transmission electron microscope (TEM). As a result, it was found that a plurality of crystalline nucleuses were dotted all over the surface as for each of plasma treated a-SiGe film samples. And as a result of observing those crystalline nucleuses at one million magnification, those crystalline nucleuses were found to be of a Ge (germanium) crystal of 5.65 Å in lattice interval and of an indistinct round shape of about 300 Å in size.

Separately, the above procedures of obtaining the plasma treated a-SiGe film were repeated, except that which the flow rate of the $GeH_4$ gas at the time of forming the starting a-SiGe film was varied so that the Ge content of the resulting a-SiGe film became to be in the range of $1\times10^{-4}$ to 1 atomic % and the hydrogen plasma treating period was varied in the range of 2 to 10 seconds, to thereby obtain a plurality of hydrogen plasma treated a-SiGe film samples which were different with respect to both the Ge content and the hydrogen treatment period. Wherein, the Ge content of each of the starting a-SiGe film samples was examined by means of a secondary ion mass spectrometry (SIMS).

As for each of the resultant hydrogen plasma treated a-SiGe films, the density N of the Ge crystalline nucleuses was obtained by measuring the number of the Ge crystalline nucleuses present per unit area. The results obtained were graphically shown in FIG. 2, wherein the density N of the Ge crystalline nucleuses present in each of the resultant hydrogen treated a-SiGe film samples was shown in relation to the Ge content of the corresponding starting a-SiGe film sample.

Figure 2:
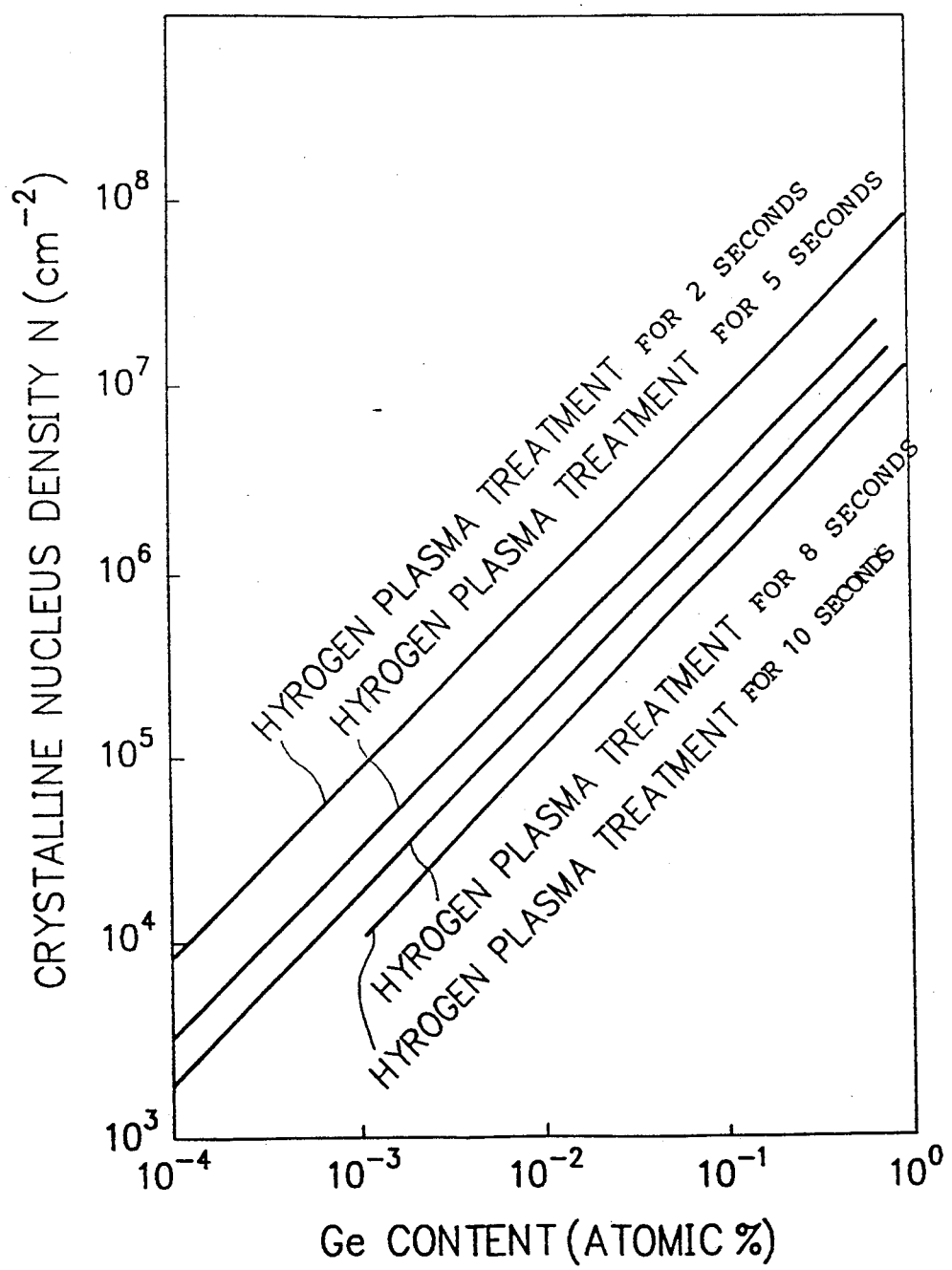
FIG. 2 shows a graph illustrating the interrelation between the density of crystalline nucleus and Ge-content with respect to a film deposited through hydrogen plasma treatment.

From the results shown in FIG. 2, it was found that the density N of a Ge crystalline nucleus formed by using an a-SiGe film and subjecting the a-SiGe film to hydrogen plasma treatment can be properly controlled by adjusting the Ge content of the starting a-SiGe film and regulating the hydrogen plasma treatment period.

There were also obtained the following findings. That is, in the case of etching an a-SiGe film formed on a substrate with hydrogen plasma, there is a distinct difference between the etching rate for the Si region and that for the Ge region, and the etching rate for the Si region is distinguishably higher than that for the Ge region; and when an a-SiGe film formed on a substrate is provided and the a-SiGe film product is subjected to hydrogen plasma treatment, a crystalline nucleus comprising germanium atoms (Ge) as the main constituent remains on the substrate.

EXPERIMENT 2

There were prepared the following two starting a-SiGe film samples (Film Samples I and II) in the same manner as in Experiment 1 and under the film-forming conditions shown in Table 1, except that $GeH_4$ gas (diluted with $H_2$ gas to 100 ppm) was used and the flow rate thereof was controlled to $2.5\times10^{-5}$ sccm at the time of forming the Film Sample I and $GeH_4$ gas (diluted with $H_2$ gas to 10000 ppm) was used and the flow rate thereof was controlled to $2.5\times10^{-3}$ sccm at the time of forming the Film Sample II.

Each of the two starting a-SiGe film samples (Film Samples I and II) thus obtained was subjected to hydrogen plasma treatment in the same manner as in Experiment 1, to thereby obtain the following two hydrogen plasma treated a-SiGe film samples (Film Samples I' and II').

Film Sample I': $1\times10^{-3}$ atomic % as for the Ge content and $2\times10^4$ cm$^{-2}$ as for the crystalline nucleus density N, and Film Sample II': $1\times10^{-1}$ atomic % as for the Ge content and $2\times10^6$ cm$^{-2}$ as for the crystalline nucleus density N.

Each of the Film Samples I' and II' was subjected to film formation by means of a conventional RF glow discharge plasma CVD technique under the conditions shown in Table 2, using the film-forming apparatus shown in FIG. 1.

That is, each of the Film Samples I' and II' was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the exhaust system (not shown). Then $H_2$ gas and Ar gas were fed into the activation space 105-1 through the gas feed pipe 102 at respective flow rates of 30 sccm and 76 sccm. At the same time, $SiF_4$ gas was fed into the film-forming space 105-2 through the gas conduit 101 at a flow rate 76 sccm. Subsequently, the inner pressure of the reaction vessel 100 was controlled to 100 mTorr by regulating the exhaust system. When the flow rate of each of the three gases became stable at the values defined above, the microwave power source of 2.45 GHz (not shown) was switched on to apply a microwave power of 400 W not only into the activation space 105-1 but also into the inside of the gas conduit 101 through the applicator 107, wherein the H$_2$ gas and the Ar gas were excited and decomposed by the action of the microwave energy to generate gas plasma containing hydrogen active species (B), which was successively flown into the film-forming space 105-2, and simultaneously, the SiF$_4$ gas supplied into the gas conduit 101 was flown into the film-forming space 105-2 while being excited and decomposed by the action of the microwave energy applied therein to generate active species (A). The gas plasma containing hydrogen active species (B) and the active species (A) were contacted and chemically reacted each other in the film-forming space 105-2 to cause the formation of a 10000 Å thick polycrystalline silicon film on the surface of the film sample placed on the substrate holder 104. The film formation herein was continued for 5 minutes. The introduction of the H$_2$ gas, the introduction of the SiF$_4$ gas and the application of the high frequency power were terminated. At the same time, the electric heater for the substrate was switched off. The introduction of the Ar gas was continued. After the inner pressure of the reaction vessel 100 became normal pressure and the film sample having the polycrystalline silicon film formed thereon cooled to room temperature, the film sample was taken out from the reaction vessel. Thus, there were obtained two polycrystalline silicon film samples (Film Samples I" and II").

The surface state of each of the two polycrystalline silicon film samples (Film Samples I" and II") was examined by a commercially available transmission electron microscope. As a result, the surface of each of the two polycrystalline silicon film samples (Film Samples I" and II") was found to be comprised of desirable polycrystal grains. As for the mean size of the polycrystal grains of each of the two polycrystalline silicon film samples (Film Samples I" and II"), it was found to be about 1 μm for the Film Sample I" and about 0.3 μm for the Film Sample II".

From the results obtained, the following findings were obtained. That is, when an a-SiGe film formed on a substrate is provided and the a-SiGe film product is subjected to hydrogen plasma treatment, a crystalline nucleus comprising germanium atoms (Ge) as the main constituent remains on the substrate; and when the process of forming a polycrystalline silicon film is performed using the substrate having such crystalline nucleus comprising germanium atoms (Ge) as the main constituent thereon, there is deposited a desirable polycrystalline silicon film with an improved crystallinity and containing crystal grains of a large grain size as large as about 1 μm in terms of mean value on said substrate.

EXPERIMENT 3

The procedures of Experiment 2 were repeated, except that an a-Si film prepared without using the GeH$_4$ gas was used instead of the starting a-SiGe film, to thereby obtain two silicon film samples.

As for each of the two silicon film samples, its surface state was examined in the same manner as in Experiment 1. As a result, the surface of each of the two silicon film samples was found to be comprised of a mixture of polycrystalline grains and a lot of amorphous phase. As for the mean size of those polycrystal grains, it was found to be about 500 Å with respect to each of the two silicon film samples.

EXPERIMENT 4

In this experiment, there was prepared a silicon film sample by repeating the procedures of Experiment 2 for forming the polycrystalline silicon film.

That is, a glass substrate (manufactured by Corning Glass Works, Article No. 7059) was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about 10$^{-5}$ Torr by actuating the exhaust system (not shown). Then H$_2$ gas and Ar gas were fed into the activation space 105-1 through the gas feed pipe 102 at respective flow rates of 30 sccm and 76 sccm. At the same time, SiF$_4$ gas was fed into the film-forming space 105-2 through the gas conduit 101 at a flow rate 76 sccm. Subsequently, the inner pressure of the reaction vessel 100 was controlled to 100 mTorr by regulating the exhaust system. When the flow rate of each of the three gases became stable at the values defined above, the microwave power source of 2.45 GHz (not shown) was switched on to apply a microwave power of 400 W not only into the activation chamber 105-1 but also into the inside of the gas conduit 101 through the applicator 107, wherein the H$_2$ gas and the Ar gas were excited and decomposed by the action of the microwave energy to generate gas plasma containing hydrogen active species (B), which was successively flown into the film-forming space 105-2, and simultaneously, the SiF$_4$ gas supplied into the gas conduit 101 was flown into the film-forming space 105-2 while being excited and decomposed by the action of the microwave energy applied therein to generate active species (A). The gas plasma containing hydrogen active species (B) and the active species (A) were contacted and chemically reacted each other in the film-forming space 105-2 to cause the formation of a 10000 Å thick silicon film on the surface of the glass substrate on the substrate holder 104. The film formation was continued for 5 minutes. The introduction of the H$_2$ gas, the introduction of the SiF$_4$ gas and the application of the high frequency power were terminated. At the same time, the electric heater for the substrate was switched off. The introduction of the Ar gas was continued. After the inner pressure of the reaction vessel 100 became normal pressure and the glass substrate having the silicon film formed thereon cooled to room temperature, it was taken out from the reaction vessel. Thus, there was obtained a silicon film sample.

As for the silicon film sample thus obtained, its surface state was examined in the same manner as in Experiment 1. As a result, the surface of the silicon film sample was found to be comprised of a mixture of polycrystalline grains and a lot of amorphous phase. As for the mean size of those polycrystal grains, it was found to be about 500 Å.

From the results obtained in Experiments 1 to 4, there was obtained the following findings. That is, (i) in the case of etching an a-SiGe film formed on a substrate with hydrogen plasma, there is a distinct difference between the etching rate for the Si region and that for the Ge region, and the etching rate for the Si region is distinguishably higher than that for the Ge region; (ii) when an a-SiGe film formed on a substrate is provided and the a-SiGe film product is subjected to hydrogen plasma treatment, a crystalline nucleus comprising germanium atoms (Ge) as the main constituent remains on the substrate; and (iii) when the process of forming a polycrystalline silicon film is performed using the substrate having such crystalline nucleus comprising germanium atoms (Ge) as the main constituent thereon, there is deposited a desirable polycrystalline silicon film with an improved crystallinity and containing crystal grains of a large grain size as large as about 1 μm in terms of mean value on said substrate. It was also found that such polycrystal silicon film with an improved crystallinity and containing crystal grains of a large grain size as large as about 1 μm in terms of mean value is hardly formed either by the foregoing film-forming method disclosed in Japanese Laid-open patent application Sho.63(1988)-44719 or by the foregoing film-forming method disclosed in International Publication No. WO90/12126.

The present invention has been accomplished based on the above findings obtained as a result of the experimental studies by the present inventors.

The film-forming process of the present invention which enables one to form a high quality silicon-containing polycrystalline film comprises the steps of (1) forming a thin film containing silicon atoms (Si) and germanium atoms (Ge) on a substrate by means of a chemical vapor deposition technique, (2) etching the thin film with the use of hydrogen gas plasma so that a crystalline nucleus comprising germanium atoms (Ge) as the main constituent remains on the substrate, and (3) growing the crystalline nucleus with the use of an active species (B) produced by decomposing a film-forming raw material gas capable of imparting at least silicon atoms (Si) and an active species (A) which is chemically reactive with the active species (B), to thereby form a silicon-containing polycrystalline film on the substrate.

The step (1) of forming the starting thin film containing silicon atoms (Si) and germanium atoms (Ge) in the present invention may be carried out by a conventional chemical vapor deposition technique. Such chemical vapor deposition technique can include a resistance heating evaporation method, an electron beam vacuum evaporation method, a plasma CVD method, a sputtering method and a method wherein an active species (a) obtained by decomposing a compound containing silicon and halogen atoms, an active species (b) obtained by decomposing a compound containing germanium and halogen atoms and an active species (c) chemically reactive with the active species (a) and (b) are contacted and chemically reacted each other to cause the formation of a thin film containing silicon and germanium atoms on a substrate in a film-forming space.

The thin film containing silicon atoms (Si) and germanium atoms (Ge) (hereinafter referred to as Si-Ge thin film) formed in the step (1) may or may not contain either hydrogen atoms (H) or halogen atoms (X). The composition ratio between the silicon atoms (Si) and the germanium atoms (Ge) contained the Si-Ge thin film may be graded by properly changing the flow rate of either a raw material gas imparting silicon atoms (Si) or a raw material gas imparting germanium atoms (Ge) upon film formation.

As for the composition ratio of the germanium atoms (Ge) to the silicon atoms (Si), it is controlled to an appropriate value with a due care so that a desirable crystalline nucleus comprising germanium atoms (Ge) as the main constituent remains on the substrate when the Si-Ge thin film is treated with hydrogen gas plasma in the step (2). However, said composition ratio is desired to be controlled such that the germanium atoms (Ge) is of a content $1 \times 10^{-4}$ atomic % to 50 atomic % versus the silicon atoms (Si).

The thickness of the Si-Ge thin film is also important in order to attain the object of the present. The thickness of the Si-Ge thin film is properly determined with a due care so that a desirable crystalline nucleus comprising germanium atoms (Ge) as the main constituent remains on the substrate when the Si-Ge thin film is treated with hydrogen gas plasma in the step (2). Specifically, the thickness of the Si-Ge thin film is desired to be preferably 2 to 2000 Å or more preferably, 10 to 1000 Å.

As for the texture of the Si-Ge thin film, it may be either of a banded texture or of a continuous texture.

The Si-Ge thin film may be amorphous, microcrystalline, polycrystalline or single-crystalline as long as a desirable crystalline nucleus comprising germanium atoms (Ge) as the main constituent is provided on the substrate when the Si-Ge thin film is treated with hydrogen plasma in the step (2). A pronounced effect is provided when the Si-Ge thin film is amorphous, since an amorphous thin film containing silicon atoms (Si) and germanium atoms (Ge) (that is, a-SiGe thin film) as the starting Si-Ge film can be effectively and relatively easily formed in the step (1) and the a-SiGe thin film is efficiently etched with hydrogen plasma to provide a desirable crystalline nucleus comprising germanium atoms (Ge) on the substrate in the step (2).

The etching treatment with hydrogen plasma in the step (2) is performed by supplying hydrogen plasma containing active species, produced as a result of exciting and decomposing hydrogen gas by the action of a high frequency energy or a magnetic wave energy of DC (direct current) applied to said hydrogen gas, to the Si-Ge thin film formed on the substrate to etch the Si-Ge thin film, wherein the silicon atoms (Si) are released from the Si-Ge thin film while leaving the germanium atoms (Ge) on the substrate in the form of a crystalline nucleus comprising germanium atom (Ge) as the main constituent.

The temperature of the substrate having the Si-Ge film thereon at the time of performing the etching treatment with hydrogen plasma of the step (2) should be properly determined depending upon the kind of the substrate and other related factors. However, in general, it is desired to be preferably room temperature to 400° C. or more preferably, 150° C. to 300° C.

As for the high frequency energy or the magnetic wave energy of DC applied in order to produce the hydrogen plasma in the step (2), it is desired to be preferably in the range of 0.1 to 50 W/cm² or more preferably, 0.5 to 15 W/cm².

As for the period during which the Si-Ge film formed on the substrate is treated with hydrogen plasma (the etching period with the use of hydrogen plasma) to provide a desirable crystalline nucleus comprising germanium atoms (Ge) on the substrate in the step (2) wherein the high frequency energy or the magnetic wave energy of DC is applied with an energy density in the above range, it is desired to be preferably 0.5 to 1800 seconds or more preferably, 1 to 600 seconds.

The substrate on which the starting Si-Ge thin film and then the polycrystalline silicon film are formed in the present invention can includes conductive materials including semiconductor films, insulating materials, light transmissive materials, light non-transmissive materials, flexible materials, and the like.

The step (3) of forming a silicon-containing polycrystalline film (hereinafter referred to as poly-Si film) by growing the crystalline nucleus comprising germanium atoms (Ge) as the main constituent formed on the substrate in the step (2) may be performed by means of a chemical vapor deposition technique using an appropriate CVD apparatus. In a preferred embodiment, the step (3) is performed by separately introducing a active species (A) produced by decomposing a raw material capable of supplying silicon atoms (Si) (hereinafter referred to as Si-supplying raw material) and an active species (B), which is chemically reactive with the active species (A), into a film forming space in which the substrate having the crystalline nucleus comprising germanium atoms (Ge) as the main constituent thereon is placed, and contacting and chemically reacting the active species (A) with the active species (B) to cause crystal growth from the crystalline nucleus comprising germanium atoms (Ge) as the main constituent, whereby forming a poly-Si film on the substrate maintained at a predetermined temperature. In this case, it is possible possible to use an active species (C) produced by decomposing a raw material capable of supplying germanium atoms (Ge) (hereinafter referred to as Ge-supplying raw material) in addition to the active species (A). In this case, there is formed a polycrystalline silicon (Si) and germanium (Ge)-containing film (hereinafter referred to as poly-SiGe film).

In an alternative of the case of forming a poly-SiGe film, it is possible to perform the formation of a poly-SiGe film by introducing the Si-supplying raw material and the Ge-supplying raw material into the film-forming space in which the substrate having the crystalline nucleus comprising germanium atoms (Ge) as the main constituent thereon is placed while mixing the two raw materials, and subjecting the mixture of the two raw materials to the action of an activation energy to produce the active species (A) and (C) while introducing the active species (B) thereinto, wherein the active species (A), (B) and (C) are contacted and chemically reacted each other to cause crystal growth from the crystalline nucleus comprising germanium atoms (Ge) as the main constituent, whereby forming a poly-SiGe film on the substrate maintained at a predetermined temperature. The activation energy in this case can includes electromagnetic energy of microwave, RF, low frequency, direct current, etc., heat energy of infrared ray, etc., or light energy.

The active species (A) may be produced by subjecting the Si-supplying raw material in gaseous state to the action of an activation energy such as electromagnetic energy of microwave, RF, low frequency, direct current, etc., heat energy of infrared ray, etc., or light energy, if necessary while making the Si-supplying raw material in contact with an appropriate catalyst, to decompose the Si-supplying raw material.

The Si-supplying raw material can includes gaseous or gasifiable silicon and halogen-containing compounds such as chain or cyclic silicon hydrides, part or the entire of the hydrogen atoms being substituted by halogen atoms. Examples of such compounds are chain silicon halogenides represented by the general formula $Si_uY_{2u+2}$ with u being an integer of 1 or above and Y being F, Cl, Br or I, cyclic silicon halogenides represented by the formula $Si_vY_{2v}$ with v being an integer of 3 or above and Y being the same meaning as the above, and chain or cyclic compounds represented by the general formula $Si_uH_xY_y$ with u and Y being respectively the same meaning as the above, in which $x+y=2u$ or $2u+2$.

Specific examples of these compounds are $SiF_4$, $(SiF_2)_5$, $(SiF_2)_6$, $(SiF_2)_4$, $Si_2F_6$, $Si_3F_8$, $Si_4F_{10}$, $SiHF_3$, $SiH_2F_2$, $SiH_3F$, $SiCl_4$, $(SiCl_2)_5$, $SiBr_4$, $(SiBr_2)_5$, $Si_2Cl_6$, $Si_3Cl_8$, $Si_2Br_6$, $Si_3Br_8$, $SiHCl_3$, $SiH_2Cl_2$, $SiHBr_3$, $SiH_2Br_2$, $SiHI_3$, $SiH_2I_2$, $SiH_3F_3$, $SiCl_3F_3$, etc. These silicon compounds may be used alone or in combination of two or more of them.

The active species (C) may be produced by subjecting the Ge-supplying raw material in gaseous state to the action of electromagnetic energy of microwave, RF, low frequency, direct current, etc., heat energy of infrared ray, etc., or light energy, if necessary while making the Si-supplying raw material in contact with an appropriate catalyst, to decompose the Si-supplying raw material.

The Ge-supplying raw material can includes gaseous or gasifiable germanium and halogen-containing compounds such as chain or cyclic germanium hydrides, part or the entire of the hydrogen atoms being substituted by halogen atoms. Examples of such compounds are chain germanium halogenides represented by the general formula $Ge_uY_{2u+2}$ with u being an integer of 1 or above and Y being F, Cl, Br or I, cyclic germanium halogenides represented by the formula $Ge_vY_{2v}$ with v being an integer of 3 or above and Y being the same meaning as the above, and chain or cyclic compounds represented by the general formula $Ge_uH_xY_y$ with u and Y being respectively the same meaning as the above, in which $x+y=2u$ or $2u+2$.

Specific examples of these compounds are $GeF_4$, $(GeF_2)_5$, $(GeF_2)_6$, $(GeF_2)_4$, $Ge_2F_6$, $Ge_3F_8$, $GeHF_3$, $GeH_2F_2$, $GeH_3F$, $GeCl_4$, $(GeCl_2)_5$, $GeHCl_3$, $GeHBr_3$, $GeHI_3$, $Ge_2Cl_3F_3$, etc. These germanium compounds may be used alone or in combination of two or more of them.

The active species (B) used in the step (3) is an active species produced from hydrogen gas ($H_2$) or/and a gaseous halogen compound such as $F_2$, $Cl_2$, $Br_2$, $I_2$, etc. The active species (B) ma be produced by subjecting one or more of these gaseous raw materials to the action of an activation energy such as electromagnetic energy of microwave, RF, low frequency, direct current, etc., heat energy of infrared ray, etc., or light energy, if necessary while making the gaseous raw material in contact with an appropriate catalyst, to decompose the gaseous raw material. In this case, it is possible to use an inert gas such as He, Ar or Ne together with the gaseous raw material upon producing the active species (B).

AS for the volume ratio of the active species (B) to be introduced into the film-forming space upon forming a poly-Si film or a poly-SiGe film by causing chemical reaction among the active species (A) and (B) or among the active species (A), (B) and (C) in the step (3), it should be properly decided depending upon the film-forming conditions employed. However in general, the volume ratio of the active species (B) to the active species (A) or the sum of the active species (A) and (C) on the basis of the flow ratio is preferably 20:1 to 1:20, and more preferably, 10:1 to 1:10.

The poly-Si film or the poly-SiGe film to be formed according to the film-forming process of the present invention may be doped with an impurity of p-type or n-type during or after the film formation thereof. As such p-type impurity, there can be illustrated elements belonging to Group IIIA of the periodic table such as B, Al, Ga, In and Tl. As such n-type impurity, there can be illustrated elements belonging to Group VA of the periodic table such as P, As, Sb and Bi. Among these elements, B, Ga, P and Sb are the most appropriate. The amount of these elements to be incorporated into the poly-Si film or the poly-SiGe film should be properly determined depending upon the electric and optical characteristics desired for the poly-Si film or the poly-SiGe film.

In order to incorporate the foregoing p-type or n-type impurity into the poly-Si film or the poly-SiGe film, there is used a gaseous of gasifiable compound capable of imparting the foregoing impurity of p-type or n-type.

Specific examples of the gaseous or gasifiable compound capable of imparting the foregoing p-type impurity (hereinafter referred to as p-type impurity-imparting compound) are $BF_3$, $BCl_3$, $BBr_3$, $B_2H_6$, $B_3H_9$, $B_4H_{10}$, $B_5H_{11}$, $B_6H_{10}$, $B_6H_{12}$, $B(CH_3)_3$, $B(C_2H_5)_3$, $AlCl_3$, $Al(CH_3)_3$, $Al(C_2H_5)_3$, etc. These p-type impurity-imparting compounds may be used alone or in combination of two or more of them.

Specific examples of the gaseous or gasifiable compound capable of imparting the foregoing n-type impurity (hereinafter referred to as n-type impurity-imparting compound) are $PH_3$, $P_2H_4$, $PF_3$, $PF_5$, $PCl_3$, $P(CH_3)_3$, $P(C_2H_5)_3$, $AsH_3$, $AsF_3$, $AsF_5$, $AsCl_3$, $As(CH_3)_3$, $As(C_2H_5)_3$, $SbF_5$, $SbH_3$, etc. These n-type impurity-imparting compounds may be used alone or in combination of two or more of them.

In the case of incorporating the foregoing p-type or n-type impurity into the poly-Si film during the film formation thereof, the p-type or n-type impurity-imparting compound is introduced into the film-forming space together with the Si-supplying raw material.

Similarly, in the case of incorporating the foregoing p-type or n-type impurity into the poly-SiGe film during the film formation thereof, the p-type or n-type impurity-imparting gaseous raw material is introduced into the film-forming space together with the Si-supplying raw material or the Ge-supplying raw material.

The gas pressure (inner pressure in other words) in the film-forming space upon forming the poly-Si film or the poly-SiGe film by causing chemical reaction among the active species (A) and (B) or among the active species (A), (B) and (C) to grow the crystalline nucleus comprising germanium atoms as the main constituent formed on the substrate in the step (3) should be properly determined with a due care to the reactivities of the kinds of those active species used. However, in general, it is desired to be preferably 0.1 mTorr to 20 Torr or more preferably, 1 mTorr to 3 Torr.

The temperature of the substrate upon forming the poly-Si film or the poly-SiGe film by causing chemical reaction among the active species (A) and (B) or among the active species (A), (B) and (C) to grow the crystalline nucleus comprising germanium atoms as the main constituent formed on the substrate in the step (3) should be properly determined with a due care to the reactivities of the kinds of those active species used. However, in general, it is desired to be preferably room temperature to 400° C. or more preferably, 150° C. to 300° C.

As above described, according to the present invention, a desirable poly-Si film or a desirable poly-SiGe film respectively containing crystal grains of a large grain size with small grain boundaries may be effectively formed optionally on insulating materials, conductive materials such as semiconductor films, light transmissive materials, light non-transmissive materials, flexible materials, etc.

Further, according to the present invention, it is possible to form a partial region comprising a poly-Si film or a poly-SiGe film on any of the above-mentioned materials. In this case, a member having a layer region comprising an a-SiGe film and other layer region comprising a material which is hardly etched with hydrogen plasma and is incapable of forming a crystalline nucleus such as silicon dioxide, calcium fluoride, etc. thereon is firstly provided. The layer region comprising silicon dioxide in this case may be formed by means of thermal oxidation technique, chemical vapor deposition technique or plasma chemical vapor deposition technique. The layer region comprising calcium fluoride may be formed by means of resistance heating evaporation or electron beam evaporation. The layer region comprising a-SiGe film may be formed in the same manner as in the case of forming the foregoing a-SiGe film in the step (1).

The member having the layer region comprising the a-SiGe film and the layer region comprising silicon dioxide or calcium fluoride thereon thus provided is subjected to the etching treatment with the use of hydrogen plasma in the step (2), wherein only the layer region comprising the a-SiGe film is selectively etched so that a crystalline nucleus comprising germanium atoms (Ge) remains on the base member without the other layer region being etched.

The resultant obtained in the step (2) is subjected to the film formation of the step (3), wherein the crystalline nucleus comprising germanium atoms as the main constituent is preferentially grown to form a poly-Si film or a poly-SiGe film without causing the formation of such film on the layer region comprising silicon dioxide or calcium fluoride. As a result, there is obtained a member having a layer region comprising the poly-Si film or the poly-SiGe film and a layer region comprising silicon dioxide or calcium fluoride.

In the following, the present invention will be described more specifically with reference to examples, which are only for illustrative purposes and are not intended to limit the scope of the invention.

EXAMPLE 1

On a well-cleaned glass substrate (manufactured by Corning Glass Works, Article No. 7059) was formed a 10 Å thick a-SiGe film of $1 \times 10^{-3}$ atomic % in Ge-content using $SiH_4$ gas, $GeH_4$ gas and $H_2$ gas by means of a conventional RF glow discharge plasma CVD technique under the film-forming conditions shown in Table 1, except that $GeH_4$ gas (diluted with $H_2$ gas to 100 ppm) was used and the flow rate thereof was controlled to $2.5 \times 10^{-5}$ sccm.

The glass substrate having the a-SiGe film thus formed thereon was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the the exhaust system (not shown). Then $H_2$ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the H$_2$ gas was excited and decomposed by the action of the microwave energy to generate hydrogen plasma, which was successively flown into the film-forming space 105-2 and supplied to the surface of the a-SiGe film. This plasma treatment was continued for 5 seconds. In this case, the a-SiGe film on the glass substrate was etched to provide crystaliine nucleuses comprising germanium atoms (Ge) as the main constituent on the surface of the glass substrate.

The introduction of the H$_2$ gas and the application of the microwave power were terminated.

Thereafter, the inside of the reaction vessel 100 was evacuated to a vacuum of about $10^{-5}$ Torr. Then, a polycrystalline silicon film doped with P was formed by growing the crystalline nucleuses formed on the glass substrate using the same apparatus as used in the above under the same film-forming conditions as those shown in Table 2, except that the SiF$_4$ gas in Table 2 was replaced by a mixed gas comprising PH$_3$/SiF$_4$ (3 ppm in concentration with respect to P). Particularly, H$_2$ gas and Ar gas were fed into the activation space 105-1 through the gas feed pipe 102 at respective flow rate of 30 sccm and 76 sccm. At the same time, the mixed gas (PH$_3$/SiF$_4$) was fed into the film-forming space 105-2 through the gas conduit 101 at a flow rate of 76 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the H$_2$ gas and the Ar gas were excited and decomposed by the action of the microwave energy to generate gas plasma containing hydrogen active species (B), which was successively flown into the film-forming space 105-2, and simultaneously, the mixed gas (PH$_3$/SiF$_4$) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the glass substrate having the Ge-crystalline nucleuses thereon to cause the formation of a 10000 Å thick polycrystalline silicon film doped with P while growing the Ge-crystalline nucleuses. The film formation herein was continued for 5 minutes.

As for the resultant polycrystalline silicon film, an Al electrode was formed on the surface thereof by means of a conventional vacuum evaporation technique and the electric characteristics of the polycrystalline silicon film were observed by a conventional Van Der Pauw method. As a result, there were obtained $4.0 \times 10^{17}$ cm$^{-3}$ in electron carrier density and 90 cm$^2$/v.s in Hall mobility. From the results, the polycrystalline silicon film was found to be excelling in the electric characteristics. Further as a result of subjecting the polycrystalline silicon film to Raman spectroscopic analysis, there was observed a peak only at the TO mode peak of Si-Si (520 cm$^{-1}$) From this, the polycrystalline silicon film was found to be truly polycrystalline. Further in addition, the polycrystalline silicon film was examined by means of a transmission electron microscope (TEM), and a a result, it was found to comprise crystal grains of 1 μm in mean grain size.

COMPARATIVE EXAMPLE 1

The procedures of Example 1 were repeated, except that the step of forming the a-SiGe film and the step of subjecting the a-SiGe film to etching treatment with the use of hydrogen plasma were not performed, to thereby obtain a silicon film doped with P.

As for the resultant silicon film, the electric characteristics thereof were observed by a conventional Van Der Pauw method. As a result, there were obtained $5.5 \times 10^{17}$ cm$^{-3}$ in electron carrier density and 10 cm$^2$/v.s in Hall mobility. From the results, the silicon film was found to be apparently inferior to the polycrystaliine film obtained in Example 1 in view of the electric characteristics. Further as a result of subjecting the silicon film to Raman spectroscopic analysis, it was found to be of a microcrystalline structure having a peak at 520 cm$^{-1}$ and a trail at 480 cm$^{-1}$. Further in addition, the silicon film was examined by means of a transmission electron microscope (TEM), and a a result, it was found to comprise microcrystalline phases of 400 Å in mean grain size.

EXAMPLE 2

Figure 3:
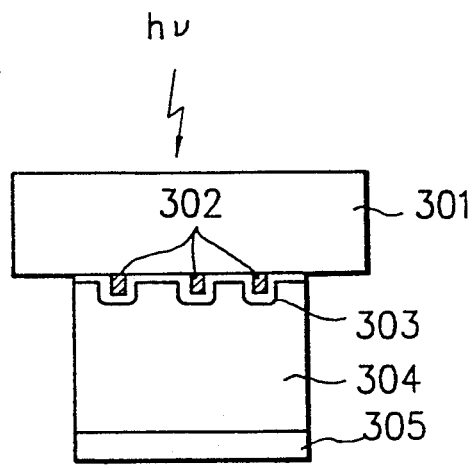
FIG. 3 is a schematic cross-section view of a solar cell of MIS (metal-insulator-silicon) type which is prepared according to the present invention.

In this example, there was prepared a polycrystaline silicon solar cell of MIS type having the constitution shown in FIG. 3.

The solar cell shown in FIG. 3 comprises a substrate 301 made of glass, a grid-shaped Al electrode 302, a silicon oxide layer 303, a polycrystalline silicon layer 304 and an Al electrode 305. This solar cell is of the configuration that light is impinged from the side of the glass substrate 301.

Firstly, there was provided a well-cleaned glass plate (manufactured by Corning Glass Works, Article No. 7059) as the substrate 301.

On the glass plate as the substrate 301 was formed a grid-shaped Al electrode 302 by means of a conventional vacuum evaporation technique. Then, there was formed a 30 Å thick SiO$_2$ film to be the silicon oxide layer 303 by means of a conventional chemical vapor deposition process under the conditions shown in Table 3.

On the SiO$_2$ film as the silicon oxide layer 303 thus formed, there was formed a polycrystalline silicon film doped with P as the polycrystalline silicon layer 304 as follows.

That is, there was firstly formed a 10 Å thick a-SiGe film of $1 \times 10^{-3}$ atomic % in Ge-content on the surface of the SiO$_2$ film using SiH$_4$ gas, GeH$_4$ gas and H$_2$ gas by means of a conventional RF glow discharge plasma CVD technique under the film-forming conditions shown in Table 1, except that GeH$_4$ gas (diluted with H$_2$ gas to 100 ppm) was used and the flow rate thereof was controlled to $2.5 \times 10^{-5}$ sccm.

The glass substrate having the a-SiGe film thus formed thereon was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the the exhaust system (not shown). Then H$_2$ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the $H_2$ gas was excited and decomposed by the action of the microwave energy to generate hydrogen plasma, which was successively flown into the film-forming space 105-2 and supplied to the surface of the a-SiGe film. In this case, the a-SiGe film on the glass substrate was etched to provide crystaliine nucleuses comprising germanium atoms (Ge) as the main constituent on the surface of the $SiO_2$ film.

The introduction of the $H_2$ gas and the application of the microwave power were terminated.

Thereafter, the inside of the reaction vessel 100 was evacuated to a vacuum of about $10^{-5}$ Torr. Then, a polycrystalline silicon film doped with P was formed by growing the crystalline nucleuses formed on the surface of the $SiO_2$ film using the same apparatus as used in the above under the same film-forming conditions as those shown in Table 2, except that the $SiF_4$ gas in Table 2 was replaced by a mixed gas comprising $PH_3/SiF_4$ (0.5 ppm in concentration with respect to P). Particularly, $H_2$ gas and Ar gas were fed into the activation space 105-1 through the gas feed pipe 102 at respective flow rate of 30 sccm and 76 sccm. At the same time, the mixed gas ($PH_3/SiF_4$) was fed into the film-forming space 105-2 through the gas conduit 101 at a flow rate of 76 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the $H_2$ gas and the Ar gas were excited and decomposed by the action of the microwave energy to generate gas plasma containing hydrogen active species (B), which was successively flown into the film-forming space 105-2, and simultaneously, the mixed gas ($PH_3/SiF_4$) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the $SiO_2$ film having the Ge-crystalline nucleuses thereon to cause the formation of a 200000 Å thick polycrystalline silicon film doped with P while growing the Ge-crystalline nucleuses. The film formation herein was continued for 100 minutes. Thus, there was formed the polycrystalline silicon layer 304 on the silicon oxide layer 303.

On the polycrystalline silicon layer 304 was formed an Al film as the Al electrode 305 by means of a conventional vacuum evaporation technique. Thus, there was obtained a MIS type solar cell of the constitution shown in FIG. 3.

As for the resultant polycrystalline silicon solar cell, the solar cell characteristics were observed. Particularly, the solar cell was subjected to measurement of a short-circuit current (Jsc) by means of a solar cell simulator wherein pseudo sun light of AM 1.5 with an intensity of 100 mW/cm² was irradiated at an ambient temperature of 25° C. As a result, there was obtained a value of 30 mA/cm² as for the Jsc. Further, the solar cell was subjected to measurement of an open-circuit voltage (Voc) by a conventional Voc-measuring method. As a result, there was obtained a value of 575 mV as for the Voc. Further in addition, on the basis of the resultant value of Jsc and the resultant value of Voc, there were obtained a value of 73% as for the fill factor (FF) and a value of 12.6% as for the photoelectric conversion efficiency ($\eta$).

From these measured results, the resultant polycrystalline silicon solar cell was found to excel in the characteristics required for a solar cell.

Separately, the polycrystalline silicon film doped with P as the polycrystalline silicon layer 304 was examined by means of a transmission electron microscope (TEM). As a result, it was found to comprise crystal grains of about 2 μm in mean grain size.

COMPARATIVE EXAMPLE 2

The procedures of Example 2 were repeated, except that the step of forming the a-SiGe film and the step of subjecting the a-SiGe film to etching treatment with the use of hydrogen plasma were not performed, to thereby obtain a MIS type polycrystalline silicon solar cell of the constitution shown in FIG. 3.

As for the resultant solar cell, the solar cell characteristics were observed in the same manner as in Example 2. As a result, there were obtained 28 mA as for the Jsc, 550 mV as for the Voc, 65% for the FF, and 10.0% for the photoelectric conversion efficiency.

Separately, the polycrystalline silicon film doped with P as the polycrystalline silicon layer 304 was examined by means of a transmission electron microscope (TEM). As a result, it was found to comprise small crystal grains of 0.4 μm in mean grain size.

EXAMPLE 3

Figure 4:
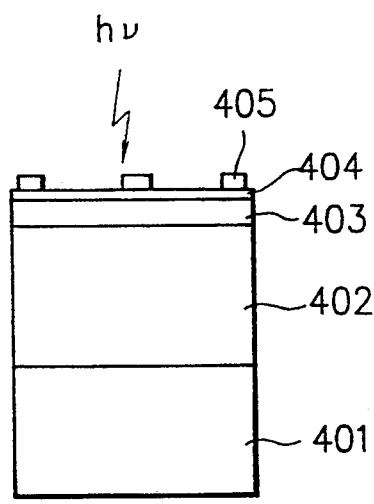
FIG. 4 is a schematic cross-section view of a pn junction solar cell which is prepared according to the present invention.

In this example, there was prepared a pn junction solar cell of the constitution shown in FIG. 4.

The pn junction solar cell shown in FIG. 4 comprises a substrate 401 made of stainless steal, an n-type semiconductor layer 402, a p-type semiconductor layer 403, a transparent and conductive layer 404 and a comb-shaped collecting electrode 405.

Firstly, there was provided a well-cleaned SUS stainless steel plate as the substrate 401.

On the stainless steel plate as the substrate 401, there was formed a polycrystalline silicon and germanium film doped with P (hereinafter referred to as poly-SiGe:P film) to be the n-type semiconductor layer 402 as follows.

That is, there was firstly formed a 10 Å thick a-SiGe film of $1 \times 10^{-3}$ atomic % in Ge-content on the surface of the substrate using $SiH_4$ gas, $GeH_4$ gas and $H_2$ gas by means of a conventional RF glow discharge plasma CVD technique under the film-forming conditions shown in Table 1, except that $GeH_4$ gas (diluted with $H_2$ gas to 100 ppm) was used and the flow rate thereof was controlled to $2.5 \times 10^{-5}$ sccm.

The substrate having the a-SiGe film thus formed thereon was positioned on the substrate holder 104 of the film-forming apparatus shown in FIG. 1. The substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the the exhaust system (not shown). Then $H_2$ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the $H_2$ gas was excited and decomposed by the action of the microwave energy to generate hydrogen plasma, which was successively flown into the film-forming space 105-2 and supplied to the surface of the a-SiGe film. In this case, the a-SiGe film on the substrate was etched to provide crystalline nucleuses comprising germanium atoms (Ge) as the main constituent on the surface of the substrate. The introduction of the $H_2$ gas and the application of the microwave power were terminated. Thereafter, the inside of the reaction vessel 100 was evacuated to a vacuum of about $10^{-5}$ Torr. Then, the poly-SiGe:P film was formed by growing the crystalline nucleuses formed on the surface of the substrate using the same apparatus as used in the above under the same film-forming conditions as those shown in Table 2, except that the $SiF_4$ gas in Table 2 was replaced by a mixed gas comprising $GeF_4$, $Si_2F_6$ and $PH_3$ ($GeF_4$:$Si_2F_6$=40:60, and $PH_3$/($GeF_4$+$Si_2F_6$)=1 ppm). Particularly, $H_2$ gas and Ar gas were fed into the activation space 105-1 through the gas feed pipe 102 at respective flow rate of 30 sccm and 76 sccm. At the same time, the mixed gas (comprising $GeF_4$, $Si_2F_6$ and $PH_3$) was fed into the film-forming space 105-2 through the gas conduit 101 at a flow rate of 20 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the $H_2$ gas and the Ar gas were excited and decomposed by the action of the microwave energy to generate gas plasma containing hydrogen active species (B), which was successively flown into the film-forming space 105-2, and simultaneously, the mixed gas (comprising $GeF_4$, $Si_2F_6$ and $PH_3$) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the substrate having the Ge-crystalline nucleuses thereon to cause the formation of a 20000 Å thick poly-SiGe:P film on the substrate while growing the Ge-crystalline nucleuses. The film formation herein was continued for 90 minutes. Successively, the procedures of forming the poly-SiGe:P film were repeated, except that the mixed gas comprising $GeF_4$, $Si_2F_6$ and $PH_3$ was replaced by a mixed gas comprising $SiF_4$ and $BF_3$ ($BF_3$/$SiF_4$=1 ppm) and the flow rate of the mixed gas was made to be 76 sccm, to thereby form a 200 Å thick polycrystalline silicon film doped with B (hereinafter referred to as poly-Si:B to be the p-type semiconductor layer 403 on the poly-SiGe:P film as the n-type semiconductor layer 402. On the poly-Si:B film as the p-type semiconductor layer 403 were formed an ITO film to be the transparent and conductive layer 404 then an Ag film to be the comb-shaped collecting electrode 405 respectively by means of a conventional technique.

Thus, there was obtained a pn junction solar cell of the constitution shown in FIG. 4.

As for the resultant pn junction solar cell, the solar cell characteristics were observed in the same manner as in Example 2. As a result, there were obtained 30 mA as for the Jsc, 490 mV as for the Voc, 62% for the FF, and 9.3% for the photoelectric conversion efficiency.

Separately, the poly-SiGe:P film as the n-type semiconductor layer 402 was examined by means of a transmission electron microscope (TEM). As a result, it was found to comprise crystal grains of 1 μm in mean grain size.

COMPARATIVE EXAMPLE 3

The procedures of Example 3 were repeated, except that the step of forming the a-SiGe film and the step of subjecting the a-SiGe film to etching treatment with the use of hydrogen plasma were not performed, to thereby obtain a pn junction solar cell of the constitution shown in FIG. 4.

As for the resultant pn junction solar cell, the solar cell characteristics were observed in the same manner as in Example 2. As a result, there were obtained 28.2 mA as for the Jsc, 420 mV as for the Voc, 58% for the FF, and 6.7% for the photoelectric conversion efficiency.

Separately, the silicon and germanium film doped with P as the n-type semiconductor layer 402 was examined by means of a transmission electron microscope (TEM). As a result, it was found to to be a polycrystalline silicon germanium film doped with P comprising small crystal grains of 0.2 μm in mean grain size.

EXAMPLE 4

Figure 5:
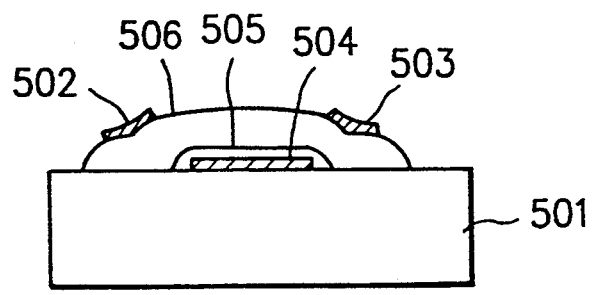
FIG. 5 is a schematic cross-section view of a thin film transistor which is prepared according to the present invention.

In this example, there was prepared a thin film transistor (TFT) of the constitution shown in FIG. 5.

The TFT shown in FIG. 5 comprises a substrate 501 made of glass, a source electrode 502, a drain electrode 503, a gate electrode 504, a silicon oxide film 505 and a polycrystalline silicon film 506.

There was firstly provided a well-cleaned glass plate (manufactured by Corning Glass Works, Article No. 7059) as the substrate 501.

On the glass plate as the substrate 501 was formed an Al gate electrode 504 by means of a conventional vacuum evaporation technique. Then, a 1500 Å thick $SiO_2$ film to be the silicon oxide film 505 by repeating the procedures of forming the $SiO_2$ film, except for changing the film-formation period to 500 seconds.

On the $SiO_2$ film thus formed, there was formed a 10 Å thick a-SiGe film of $1 \times 10^{-3}$ atomic % in Ge-content on the surface of the $SiO_2$ film using $SiH_4$ gas, $GeH_4$ gas and $H_2$ gas by means of a conventional RF glow discharge plasma CVD technique under the film-forming conditions shown in Table 1, except that $GeH_4$ gas (diluted with $H_2$ gas to 100 ppm) was used and the flow rate thereof was controlled to $2.5 \times 10^{-5}$ sccm.

The glass substrate having the a-SiGe film thus formed thereon was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the the exhaust system (not shown). Then $H_2$ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the $H_2$ gas was excited and decomposed by the action of the microwave energy to generate hydrogen plasma, which was successively flown into the film-forming space 105-2 and supplied to the surface of the a-SiGe film. In this case, the a-SiGe film on the glass substrate was etched to provide crystaliine nucleuses comprising germanium atoms (Ge) as the main constituent on the surface of the $SiO_2$ film.

The introduction of the $H_2$ gas and the application of the microwave power were terminated.

Thereafter, the inside of the reaction vessel 100 was evacuated to a vacuum of about $10^{-5}$ Torr. Then, a polycrystalline silicon film 506 was formed by growing the crystalline nucleuses formed on the surface of the $SiO_2$ film using the same apparatus as used in the above under the film-forming conditions shown in Table 2. Particularly, $H_2$ gas and Ar gas were fed into the activation space 105-1 through the gas feed pipe 102 at respective flow rate of 30 sccm and 76 sccm. At the same time, $SiF_4$ gas was fed into the film-forming space 105-2 through the gas conduit 101 at a flow rate of 76 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the $H_2$ gas and the Ar gas were excited and decomposed by the action of the microwave energy to generate gas plasma containing hydrogen active species (B), which was successively flown into the film-forming space 105-2, and simultaneously, the $SiF_4$ gas supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the $SiO_2$ film having the Ge-crystalline nucleuses thereon to cause the formation of a 1500 Å thick polycrystalline silicon film while growing the Ge-crystalline nucleuses. The film formation herein was continued for 45 seconds. Thus, there was formed the polycrystalline silicon film 506. Then, there were formed the source electrode 502 and the drain electrode respectively by means of vacuum evaporation of Al and photolithography technique.

Thus, there was obtained a TFT of the constitution shown in FIG. 5. The drift mobility of the resultant TFT was measured by a conventional method. As a result, there was obtained a good value of $u=125$ $cm^2/v.s$.

COMPARATIVE EXAMPLE 4

The procedures of Example 4 were repeated, except that the step of forming the a-SiGe film and the step of subjecting the a-SiGe film to etching treatment with the use of hydrogen plasma were not performed, to thereby obtain a TFT of the constitution shown in FIG. 5.

The drift mobility of the resultant TFT was measured by a conventional method. As a result, there was obtained a value of $u=10$ $cm^2/v.s$, apparently inferior to that of the TFT obtained in Example 4.

EXAMPLE 5

A well-cleaned glass plate (manufactured by Corning Glass Works, Article No. 7059) as the substrate was positioned on the substrate holder 104 of the film-forming apparatus shown in FIG. 1. The glass substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the exhaust system (not shown). Then, $H_2$ gas and Ar gas were fed into the activation space 105-1 through the gas feed pipe 102 at respective flow rate of 30 sccm and 76 sccm. At the same time, a mixed gas comprising $GeF_4$ and $SiF_4$ ($GeF_4/SiF_4=1\%$) was fed into the film-forming space 105-2 through the gas conduit 101 at a flow rate of 2 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 200 W not only into the activation space 105-1 but also into the inside of the gas conduit 101 through the applicator 107, wherein the $H_2$ gas and the Ar gas were excited and decomposed by the action of the microwave energy to generate gas plasma containing hydrogen active species (B), which was successively flown into the film-forming space 105-2, and simultaneously, the mixed gas (comprising $GeF_4$ and $SiF_4$) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the glass substrate to cause the formation of an a-SiGe film on the glass substrate. The period of time during which the plasma was maintained was 10 seconds.

The introduction of the foregoing gases and the application of the microwave power were terminated.

Thereafter, the inside of the reaction vessel 100 was evacuated to a vacuum of about $10^{-5}$ Torr. Then, $H_2$ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the $H_2$ gas became stable at the value defined above, the microwave power source (not shown) was switched on to apply a microwave power (2.45 GHz) of 300 W into the activation space 105-1 through the applicator 107, wherein the $H_2$ gas was excited and decomposed by the action of the microwave energy to generate hydrogen plasma, which was successively flown into the film-forming space 105-2 and supplied to the surface of the a-SiGe film. This etching process was continued for 10 seconds. In this case, the a-SiGe film on the glass substrate was etched to provide crystaliine nucleuses comprising germanium atoms (Ge) as the main constituent on the surface of the substrate.

The introduction of the H₂ gas and the application of the microwave power were terminated.

Thereafter, the inside of the reaction vessel 100 was evacuated to a vacuum of about $10^{-5}$ Torr Then, a polycrystalline silicon film was formed on the glass substrate by growing the crystalline nucleuses formed on the surface of the glass substrate using the same apparatus as used in the above. That is, H₂ gas and Ar gas were fed into the activation space 105-1 through the gas feed pipe 102 at respective flow rate of 30 sccm and 76 sccm. At the same time, SiF₄ gas was fed into the film-forming space 105-2 through the gas conduit 101 at a flow rate of 76 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the H₂ gas and the Ar gas were excited and decomposed by the action of the microwave energy to generate gas plasma containing hydrogen active species (B), which was successively flown into the film-forming space 105-2, and simultaneously, the SiF₄ gas supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the glass substrate having the Ge-crystalline nucleuses thereon to cause the formation of a 20000 Å thick polycrystalline silicon film on the glass substrate while growing the Ge-crystalline nucleuses.

The resultant polycrystalline silicon film was examined by means of a transmission electron microscope (TEM). As a result, it was found to comprise crystal grains of 1.5 μm in mean grain size.

COMPARATIVE EXAMPLE 5

The procedures of Example 5 were repeated the step of forming the starting a-SiGe film and the step of subjecting the a-SiGe film to etching treatment with the use of hydrogen plasma, to thereby obtain a polycrystalline silicon film.

The resultant polycrystalline silicon film was examined by means of a transmission electron microscope (TEM). As a result, it was found to comprise small crystal grains of 0.2 μm in mean grain size.

EXAMPLE 6

In this example, there was prepared a pin junction solar cell.

Firstly, as the substrate, there was provided a 200 um thick P-doped polycrystalline Si wafer plate of $10^{-3}$ Ωcm in resistivity which was prepared by means of a conventional casting technique. The Si wafer plate as the substrate was positioned on the substrate holder 104 of the film-forming apparatus shown in FIG. 1. The Si wafer substrate was heated to 250° C. by actuating the electric heater (not shown) of the substrate holder 104 and it was maintained at this temperature. The inside of the reaction vessel 100 was evacuated to a vacuum of about $10^{-5}$ Torr by actuating the exhaust system (not shown). Then, H₂ gas and Ar gas were fed into the activation space 105-1 through the gas feed pipe 102 at respective flow rate of 30 sccm and 76 sccm. At the same time, a mixed gas comprising GeF₄ and SiF₄ (GeF₄/SiF₄=1%) was fed into the film-forming space 105-2 through the gas conduit 101 at a flow rate of 2 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 200 W not only into the activation space 105-1 but also into the inside of the gas conduit 101 through the applicator 107, wherein the H₂ gas and the Ar gas were excited and decomposed by the action of the microwave energy to generate gas plasma containing hydrogen active species (B), which was successively flown into the film-forming space 105-2, and simultaneously, the mixed gas (comprising GeF₄ and SiF₄) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the Si wafer substrate to cause the formation of an a-SiGe film on the Si wafer substrate. The period of time during which the plasma is maintained herein was made to be 10 seconds.

The introduction of the foregoing gases and the application of the microwave power were terminated.

The a-SiGe film formed on the Si wafer substrate was subjected to etching treatment as follows. That is, H₂ gas was fed into the activation space 105-1 through the gas feed pipe 102 at a flow rate of 20 sccm. Subsequently, the inner pressure of the reaction vessel 100 was controlled to 200 mTorr by regulating the exhaust system. When the flow rate of the H₂ gas became stable at the value defined above, the microwave power source (not shown) was switched on to apply a microwave power (2.45 GHz) of 300 W into the activation space 105-1 through the applicator 107, wherein the H₂ gas was excited and decomposed by the action of the microwave energy to generate hydrogen plasma, which was successively flown into the film-forming space 105-2 and supplied to the surface of the a-SiGe film. This etching process was continued for 10 seconds. In this case, the a-SiGe film on the Si wafer substrate was etched to provide crystaliine nucleuses comprising germanium atoms (Ge) as the main constituent on the surface of the Si wafer substrate.

The introduction of the H₂ gas and the application of the microwave power were terminated.

Thereafter, the inside of the reaction vessel 100 was evacuated to a vacuum of about $10^{-5}$ Torr. Then, a polycrystalline silicon film was formed on the Si wafer substrate by growing the crystalline nucleuses formed on the surface of the Si wafer substrate using the same apparatus as used in the above. That is, H₂ gas and Ar gas were fed into the activation space 105-1 through the gas feed pipe 102 at respective flow rate of 30 sccm and 30 sccm. At the same time, SiF₄ gas was fed into the film-forming space 105-2 through the gas conduit 101 at a flow rate of 76 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 400 W not only into the activation space 105-1 but also into the inside of the gas conduit 101 through the applicator 107, wherein the H₂ gas and the Ar gas were excited and decomposed by the action of the microwave energy to generate gas plasma containing hydrogen active species (B), which was successively flown into the film-forming space 105-2, and simultaneously, the SiF₄ gas supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the Si wafer substrate having the Ge-crystalline nucleuses thereon to cause the formation of a 20000 Å thick polycrystalline silicon film on the Si wafer substrate while growing the Ge-crystalline nucleuses.

Then, a microcrystalline silicon film doped with B was formed on the polycrystalline silicon film by repeating the above procedures of forming polycrystalline silicon film, except for replacing the SiF₄ gas by a mixed gas comprising SiF₄ and BF₃ (BF₃/SiF₄=1%). That is, H₂ gas and Ar gas were fed into the activation space 105-1 through the gas feed pipe 102 at respective flow rate of 30 sccm and 76 sccm. At the same time, the mixed gas (comprising SiF₄ and BF₃) was fed into the film-forming space 105-2 through the gas conduit 101 at a flow rate of 2 sccm. Subsequently, the inner pressure of the reaction vessel 100 was controlled to 100 mTorr by regulating the exhaust system. When the flow rate of each of the gases became stable at the values above defined, the microwave power source of 2.45 GHz was switched on to apply a microwave power of 200 W not only into the activation space 105-1 but also into the inside of the gas conduit 101 through the applicator 107, wherein the H₂ gas and the Ar gas were excited and decomposed by the action of the microwave energy to generate gas plasma containing hydrogen active species (B), which was successively flown into the film-forming space 105-2, and simultaneously, the mixed gas (comprising SiF₄ and BF₃) supplied into the gas conduit 101 was flown into the film-forming space 105-2 while being excited and decomposed by the action of the microwave energy applied to generate active species (A). The gas plasma containing hydrogen active species (B) and the active species (A) were contacted and chemically reacted each other near the surface of the previously formed polycrystalline silicon film to cause the formation of a 120 Å thick micricrystalline silicon film doped with B on the polycrystalline silicon film. The period of time during which the plasma was maintained herein was 4 seconds.

The introduction of the foregoing gases and the application of the microwave power were terminated. And the electric heater of the substrate holder 104 was switched off. Thereafter, the Si wafer substrate was taken out from the film-forming apparatus. Then, on the microcrystalline silicon film doped with B were formed a transparent and conductive film and a grid-shaped electrode respectively by means of a conventional technique.

Thus, there was obtained a pin junction solar cell.

As for the resultant pin junction solar cell, its photoelectric conversion efficiency was evaluated in the same manner as in Example 2. As a result, it was found that the pin junction solar cell exhibits a satisfactory photoelectric conversion efficiency of 10.5% or more.

Separately, the resultant pin junction solar cell was maintained in the environment of an ambient temperature of 80° C. and an ambient humidity of 80% for 12 hours, and successively in the the environment of an ambient temperature of 0° C. and an ambient humidity of 20% for 12 hours. This cycle was continued 50 times. Thereafter, under the normal atmospheric condition, a cellophane tape was adhered to the side of the pin junction solar cell through which light is to be impinged and the cellophane tape was peeled off. As a result, only the cellophane tape was removed without causing any removal among the laminated semiconductor films.

From the results, it was found that the polycrystalline silicon film excels in adhesion not only with the substrate but also with other constituent member.

COMPARATIVE EXAMPLE 6

The procedures of Example 3 were repeated, except that the step of forming the a-SiGe film and the step of subjecting the a-SiGe film to etching treatment with the use of hydrogen plasma were not performed, to thereby obtain a pin junction solar cell.

As for the resultant pin junction solar cell, its photoelectric conversion efficiency was evaluated in the same manner as in Example 2. As a result, it was found that the pin junction solar cell exhibits a photoelectric conversion efficiency of less than 8.8%, apparently inferior to that of the pin junction solar cell obtained in Example 6.

Separately, as for the resultant pin junction solar cell, the same peeling test as in Example 6 was performed. As a result, removal was occurred between the Si wafer substrate and the polycrystalline silicon film formed on the Si wafer substrate.

TABLE 1

| gas used | flow rate |
| --- | --- |
| SiH | 5 sccm |
| GeH₄* | $2.5 \times 10^{-6} \sim 2.5 \times 10^{-2}$ sccm |
| H₂ | 20 sccm |
| RF power | 1 W |
| inner pressure | 500 m Torr |
| substrate temperature | 250° C. |
| deposition rate | 1 Å/sec |

*the flow rate of the GeH₄ is adjusted by diluting with H₂ gas.

TABLE 2

|  | gas used | flow rate |
| --- | --- | --- |
| gas conduit 101 | SiF₄ | 76 sccm |
| gas feed pipe 102 | H₂ | 30 sccm |
|  | Ar | 76 sccm |
| high frequency power |  | 2.45 GHz, 400 W |
| substrate temperature |  | 250° C. |
| inner pressure |  | 100 m Torr |

TABLE 3

| gas used | flow rate |
| --- | --- |
| SiH₄ | 10 sccm |
| O₂ | 1 sccm |
| substrate temperature | 320° C. |
| inner pressure | 100 m Torr |

What we claim is:

1. A process for forming a silicon-containing polycrystalline film on a substrate by a chemical vapor deposition method, said process comprises the steps of:
   (a) forming a thin film comprising silicon and germanium atoms on said substrate, (b) subjecting said film to etching treatment so that a crystalline nucleus comprising germanium atoms as the main constituent remains on the surface of said substrate, and (c) growing said crystalline nucleus to thereby form a silicon-containing polycrystalline film on said substrate.

2. The process according to claim 1, wherein the etching treatment in the step (b) is performed with the use of hydrogen plasma.

3. The process according to claim 1, wherein the step (c) is performed by separately introducing into a film-forming space an active species (A) produced by decomposing a compound containing silicon and halogen atoms and an active species (B) which is chemically reactive with said active species (A) and chemically reacting said active species (A) and said active species (B) in said film-forming space while growing the crystalline nucleus.

4. The process according to claim 1, wherein the film comprising silicon and germanium atoms formed in the step (a) is of a thickness of 2 to 2000 Å.

5. The process according to claim 1, wherein the thin film containing silicon and germanium atoms formed in the step (a) contains $1 \times 10^{-4}$ to 50 atomic % of the germanium atoms versus the silicon atoms.

6. The process according to claim 1, wherein the formation of the film containing silicon and germanium atoms in the step (a) is performed while maintaining the substrate at a temperature of room temperature to 400° C.

7. The process according to claim 2, wherein the etching treatment with the use of hydrogen plasma is performed by using hydrogen plasma which is generated by applying an electromagnetic energy of 0.1 to 50 W/cm² onto hydrogen gas.

8. The process according to claim 7, wherein the electromagnetic energy is of high frequency wave or direct current.

9. The process according to claim 2, wherein the etching treatment with the use of hydrogen plasma is performed for 0.5 to 1800 seconds.

* * * * *

UNITED STATES PATENT AND TRADEMARK OFFICE
CERTIFICATE OF CORRECTION

PATENT NO. : 5,246,886
DATED : September 21, 1993
INVENTOR(S) : AKIRA SAKAI, ET AL.

Page 1 of 4

It is certified that error appears in the above-identified patent and that said Letters Patent is hereby corrected as shown below:

ON TITLE PAGE

In [56] References Cited, under OTHER PUBLICATIONS:
"SiO2" should read --$SiO_2$--.

IN THE DRAWINGS

Sheet 2 of 3, FIG. 2, "HYROGEN" (all occurrences)
should read --HYDROGEN--.

COLUMN 1

Line 55, "of the" should be deleted.

COLUMN 2

Line 22, "as" should read --as a--.
Line 65, "relative" should read --relative to--.

COLUMN 3

Line 32, "what" should read --what is--.
Line 46, "of the" should be deleted.
Line 47, "Other" should read --Another--.
Line 67, "of the" should be deleted.

COLUMN 4

Line 28, "is" should read --are--.

UNITED STATES PATENT AND TRADEMARK OFFICE
CERTIFICATE OF CORRECTION

PATENT NO. : 5,246,886
DATED : September 21, 1993
INVENTOR(S) : AKIRA SAKAI, ET AL.

Page 2 of 4

It is certified that error appears in the above-identified patent and that said Letters Patent is hereby corrected as shown below:

COLUMN 13

Line 8, "a" should read --an--.
Line 22, "possible possible" should read --possible--.
Line 46, "includes" should read --include--.
Line 57, "includes" should read --include--.

COLUMN 14

Line 18, "includes" should read --include--.
Line 41, "ma" should read --may--.
Line 51, "AS" should read --As--.

COLUMN 15

Line 11, "of" should read --or--.

COLUMN 16

Line 7, "other" should read --another--.

COLUMN 17

Line 10, "crystaliine" should read --crystalline--.

COLUMN 18

Line 1, "a a" should read --as a--.
Line 16, "taliine" should read --talline--.
Line 22, "a a" should read --as a--.

UNITED STATES PATENT AND TRADEMARK OFFICE
CERTIFICATE OF CORRECTION

PATENT NO. : 5,246,886

DATED : September 21, 1993

INVENTOR(S) : AKIRA SAKAI, ET AL.

It is certified that error appears in the above-identified patent and that said Letters Patent is hereby corrected as shown below:

COLUMN 19

Line 12, "crystaliine" should read --crystalline--.

COLUMN 21

Line 14, "crystaliine" should read --crystalline--.

COLUMN 22

Line 32, "to to" should read --to--.
Line 67, "the the" should read --the--.

COLUMN 23

Line 14, "crystaliine" should read --crystalline--.

COLUMN 24

Line 66, "crystaliine" should read --crystalline--.

COLUMN 25

Line 4, "$10^{-5}$ Torr" should read --$10^{-5}$ Torr.--.
Line 42, "repeated the" should read --repeated, except that the--.

COLUMN 26

Line 46, "crystaliine" should read --crystalline--.

UNITED STATES PATENT AND TRADEMARK OFFICE
CERTIFICATE OF CORRECTION

PATENT NO. : 5,246,886
DATED : September 21, 1993
INVENTOR(S) : AKIRA SAKAI, ET AL.

It is certified that error appears in the above-identified patent and that said Letters Patent is hereby corrected as shown below:

COLUMN 28

Line 1, "the the" should read --the--.
    Line 12, "member" should read --members--.
    Line 66, "comprises" should read --comprising--.
    Line 67, "thin" should be deleted.

COLUMN 30

Line 4, "thin" should be deleted.

Signed and Sealed this

Twentieth Day of September, 1994

Attest:

BRUCE LEHMAN

*Attesting Officer*     *Commissioner of Patents and Trademarks*